US012607941B2

(12) United States Patent
Chen

(10) Patent No.: US 12,607,941 B2
(45) Date of Patent: Apr. 21, 2026

(54) SEMICONDUCTOR STRUCTURE AND METHOD FOR FORMING THE SAME

(71) Applicant: Winbond Electronics Corp., Taichung City (TW)

(72) Inventor: Yen-Chiao Chen, Taichung City (TW)

(73) Assignee: WINBOND ELECTRONICS CORP., Taichung City (TW)

( * ) Notice: Subject to any disclaimer, the term of this patent is extended or adjusted under 35 U.S.C. 154(b) by 818 days.

(21) Appl. No.: 17/841,967

(22) Filed: Jun. 16, 2022

(65) Prior Publication Data

US 2023/0010665 A1 Jan. 12, 2023

(30) Foreign Application Priority Data

Jul. 9, 2021 (TW) .................................. 110125348

(51) Int. Cl.
*G03F 7/00* (2006.01)
*H10P 74/00* (2026.01)
*H10P 74/20* (2026.01)

(52) U.S. Cl.
CPC ........ *G03F 7/7065* (2013.01); *G03F 7/70633* (2013.01); *G03F 7/70658* (2013.01); *H10P 74/203* (2026.01); *H10P 74/277* (2026.01)

(58) Field of Classification Search
CPC .............. G03F 7/7065; G03F 7/70633; G03F 7/70658; H01L 22/12; H01L 22/34; H10P 74/203; H10P 74/277
See application file for complete search history.

(56) References Cited

U.S. PATENT DOCUMENTS

| | | | | | |
|---|---|---|---|---|---|
| 5,699,282 | A | * | 12/1997 | Allen et al. .......... | G01R 35/005 702/85 |
| 7,317,203 | B2 | | 1/2008 | Chen et al. | |
| 7,638,878 | B2 | * | 12/2009 | Aritome et al. ....... | H10D 89/10 257/758 |
| 2009/0011539 | A1 | * | 1/2009 | Jeng ........................ | H01L 22/34 438/107 |

FOREIGN PATENT DOCUMENTS

| | | |
|---|---|---|
| CN | 102723294 A | 10/2012 |
| CN | 103500721 A | 1/2014 |
| CN | 105990316 A | 10/2016 |

* cited by examiner

*Primary Examiner* — Christine S. Kim
*Assistant Examiner* — Nathalie R Fayette
(74) *Attorney, Agent, or Firm* — Birch, Stewart, Kolasch & Birch, LLP

(57) ABSTRACT

A semiconductor structure includes vertical conductive features disposed over a substrate, and horizontal conductive features disposed over the vertical conductive features. The horizontal conductive features include first and second conductive lines respectively electrically connected to the first and second vertical conductive features, a first conductive segment disposed between the first vertical conductive feature and the second conductive line, and a second conductive segment disposed between the first conductive line and the second vertical conductive feature. The first conductive segment is electrically isolated from the vertical conductive features. The second conductive segment is electrically isolated from the vertical conductive features.

16 Claims, 6 Drawing Sheets

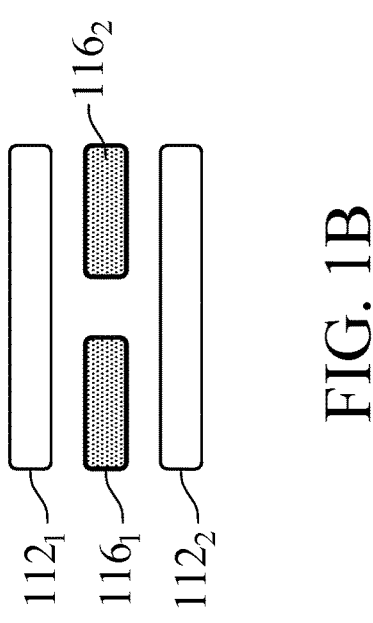
FIG. 1B
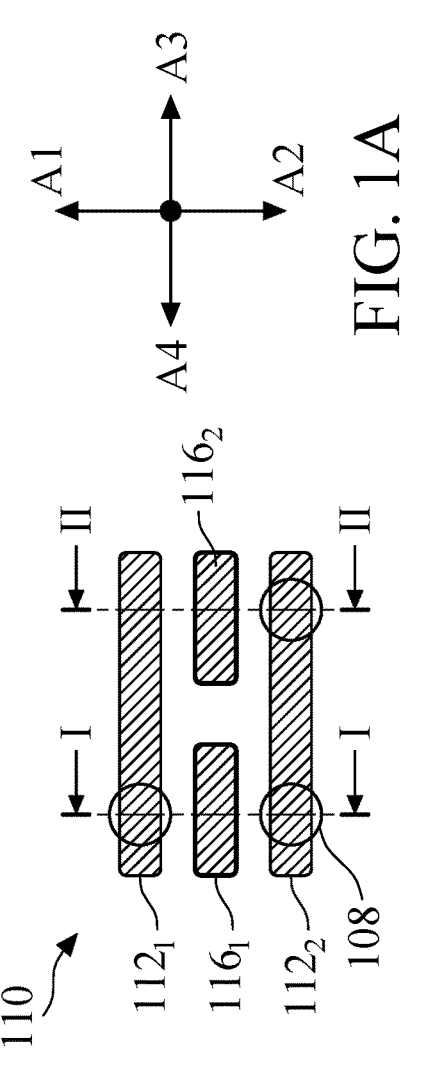
FIG. 1A
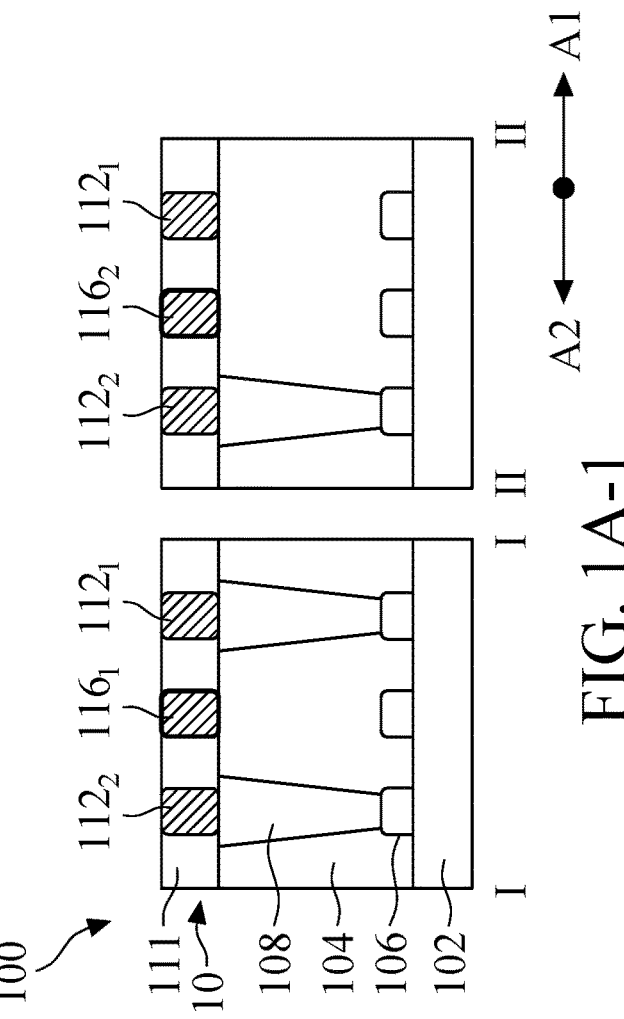
FIG. 1A-1
FIG. 1-1

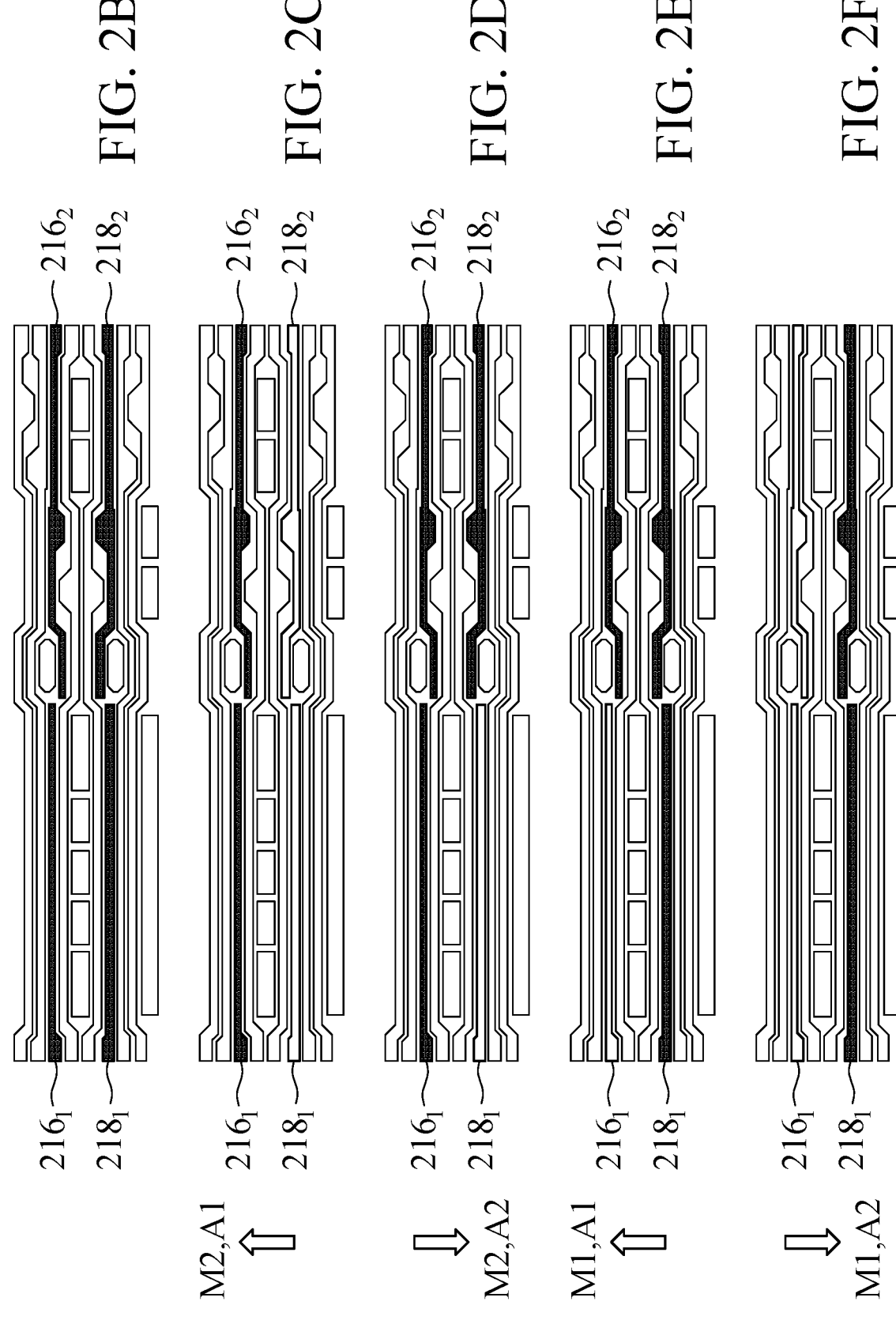

SEMICONDUCTOR STRUCTURE AND METHOD FOR FORMING THE SAME

CROSS REFERENCE TO RELATED APPLICATIONS

This application claims the benefit of Taiwan Patent Application No. 110125348 filed on Jul. 9, 2021, entitled "SEMICONDUCTOR STRUCTURE AND METHOD FOR FORMING THE SAME" which is hereby incorporated herein by reference.

BACKGROUND

Field of the Disclosure

The present disclosure relates to a semiconductor structure, and in particular, it relates to a semiconductor structure having a test element group.

Description of the Related Art

As the current semiconductor manufacturing technology continues to work towards the miniaturization of component sizes, many challenges arise in the effort to increase the density of components in semiconductors and improve their overall performance. For example, it is a challenge to improve the speed of defect detection in the peripheral circuit area and provide valuable defect information.

SUMMARY

In some embodiments of the disclosure, a semiconductor structure is provided. The semiconductor includes vertical conductive features disposed over a substrate, and horizontal conductive features disposed over the vertical conductive features. The horizontal conductive features include first conductive line and second conductive line respectively electrically connected to a first vertical conductive feature and a second vertical conductive feature of the vertical conductive features, a first conductive segment disposed between the first vertical conductive feature and the second conductive line, and a second conductive segment disposed between the first conductive line and the second vertical conductive feature. The first conductive segment is electrically isolated from the vertical conductive features. The second conductive segment is electrically isolated from the vertical conductive features.

In some embodiments of the disclosure, a semiconductor structure is provided. The semiconductor structure includes conductive plugs disposed over a substrate, a first conductive line, a second conductive line, a first conductive segment and a second conductive segment disposed over the conductive plugs and extending in a first direction. The first conductive segment and the second conductive segment are disposed between the first conductive line and the second conductive line. The first conductive line is electrically connected to a first contact plug of the conductive plugs, and the second conductive line is electrically connected to a second contact plug of the conductive plugs. A projection area of the first conductive segment projected onto the first conductive line in a second direction covers the first contact plug, and the second direction is perpendicular to the first direction. A projection area of the second conductive segment projected onto the second conductive line in a third direction covers the second contact plug, and the third direction is perpendicular to the first direction and opposite to the second direction.

In some embodiments of the disclosure, a method for forming a semiconductor structure is provided. The method includes forming contact plugs over a substrate, forming a dielectric layer over the contact plugs, etching the dielectric layer using a first patterned mask layer to form a first trench and a second trench, etching the dielectric layer using a second patterned mask layer to form a third trench and a fourth trench, and depositing a metal material to form a first conductive segment in the first trench, a second conductive segment in the second trench, a first conductive line in the third trench, and a second conductive line in the fourth trench. The first conductive segment is electrically isolated from the contact plugs. The second conductive segment is electrically isolated from the contact plugs. The first conductive line and the second conductive line are electrically connected to a first contact plug and a second contact plug of the contact plugs respectively.

BRIEF DESCRIPTION OF THE DRAWINGS

The present disclosure can be further understood by reading the subsequent detailed description and examples with references made to the accompanying drawings, wherein:

FIGS. 1A, 2A and 3A are plan views of horizontal conductive features of a semiconductor structure, in accordance with some embodiments of the present disclosure.

FIG. 1A-1 is a cross-sectional view of a semiconductor structure, in accordance with some embodiments of the present disclosure.

FIGS. 1B, 1C, 1D, 2B, 2C, 2D, 2E, 2F, 3B, 3C, 3D, 3E and 3F are plan views of horizontal conductive features during an e-beam inspection, in accordance with some embodiments of the present disclosure.

FIGS. 1C-1 and 1D-1 are cross-sectional views of a semiconductor structure, in accordance with some embodiments of the present disclosure.

DETAILED DESCRIPTION

Figures 1, 1C, 1D:
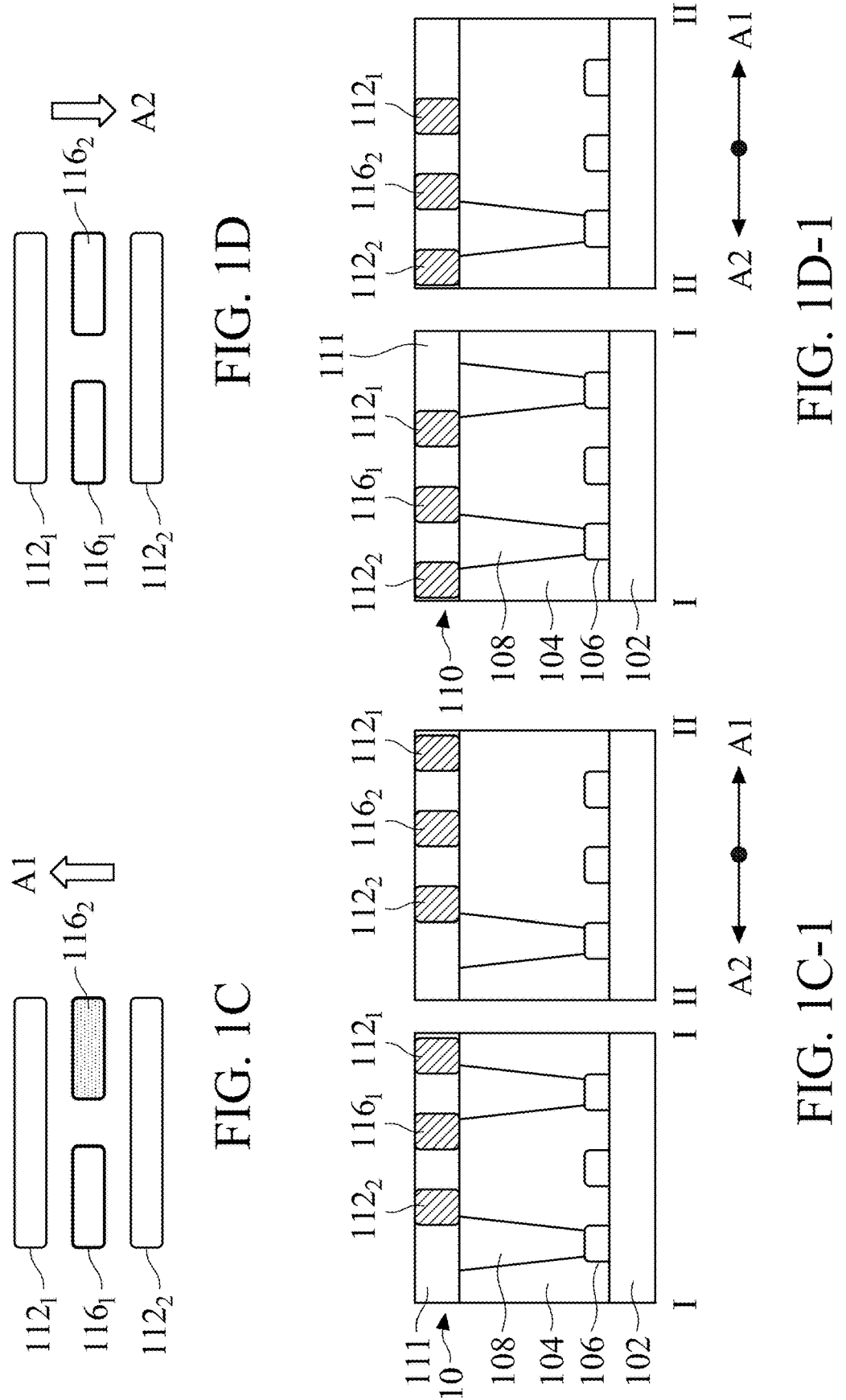

FIG. 1A is a plan view of horizontal conductive features 110 of a semiconductor structure 100, in accordance with some embodiments of the present disclosure. FIG. 1A-1 is a cross-sectional view of the semiconductor structure 100, in which a left part and a right part of FIG. 1A-1 are taken along line I-I and line II-II shown in FIG. 1A, in accordance with some embodiments of the present disclosure. For ease of illustration, FIG. 1A shows reference directions, in which a first direction A1, a second direction A2, a third direction A3, and a fourth direction A4 are horizontal directions that are substantially parallel to the main surface of a substrate. The first direction A1 is opposite to the second direction A2, the third direction A3 is opposite to the fourth direction D4. The first direction A1 and the second direction A2 are perpendicular to the third direction A3 and the fourth direction D4.

FIG. 1A-1 illustrates the semiconductor 100 which includes a substrate 102, a dielectric structure 104 over the substrate 102, conductive elements 106 and vertical conductive features 108 in the dielectric structure 104, and dielectric layer 111 and horizontal conductive features 110 over the dielectric structure 104.

In some embodiments, the substrate 102 may include various active devices formed on a semiconductor substrate, such as logic devices (e.g., MOSFET, BJT, HEMT, or another suitable logic device), memory devices (e.g., DRAM, flash memory, or another suitable memory device), a periphery circuit device, or another suitable active device. The substrate 102 may also include passive devices, such as resistors, capacitors, inductors, or another suitable passive device. The substrate 102 may also include an interconnect structure which is formed over and electrically connected to the active devices and/or the passive devices. The interconnect structure may include one or more dielectric layers (such as interlayer dielectric layers, inter-metal dielectric layers, or another suitable dielectric layer), and vertical conductive features (e.g., contact plugs and/or conductive vias) and horizontal conductive features (e.g., conductive lines) which are formed in the one or more dielectric layers.

In some embodiments, the dielectric structure 104 includes one or more dielectric layers. The dielectric structure 104 may include silicon oxide (SiO), silicon nitride (SiN), silicon oxynitride (SiON), silicon carbide (SiC), silicon carbon nitride (SiCN), silicon oxycarbide (SiOC), aluminum oxide (AlO), or a combination thereof.

In some embodiments, the conductive elements 106 are gate structures of transistors which are formed on the semiconductor substrate, such as polysilicon gate structures or metal gate structures, and the vertical conductive features 108 are contact plugs which are electrically connected to the gate structures. In some other embodiments, the conductive elements 106 are horizontal conductive features (e.g., conductive lines) which are electrically connected to the gate structures of the active devices through the interconnect structure, and the vertical conductive features 108 are conductive vias which are electrically connected to the conductive lines. The above-mentioned contact plugs, conductive lines and conductive vias may be made of one or more metal materials, e.g., tungsten (W), aluminum (Al), copper (Cu), titanium (Ti), tantalum (Ta), titanium nitride (TiN), tantalum nitride (TaN), or a combination thereof.

The horizontal conductive features 110 include test element groups (TEGs) and/or test keys for wafer test. The horizontal conductive features 110 includes conductive lines $112_1$ and $112_2$, and conductive segments $116_1$ and $116_2$. The horizontal conductive features 110 have longitudinal axes which extend in the third direction A3 and the fourth direction A4. Each of the conductive lines $112_1$ and $112_2$ are in contact with and electrically connected to at least one of the underlying vertical conductive features 108. The conductive segments $116_1$ and $116_2$ are separated from and electrically isolated from the vertical conductive features 108.

The horizontal conductive features 110 may be made of one or more metal materials such as tungsten (W), aluminum (Al), copper (Cu), titanium (Ti), tantalum (Ta), titanium nitride (TiN), tantalum nitride (TaN), or a combination thereof. The formation of the horizontal conductive features 110 may include forming a dielectric layer 111 over the dielectric structure 104, and forming a patterned mask layer (such as a photoresist layer or a hard mask layer) using a photolithography process over the dielectric layer 111. The material of the dielectric layer 111 may be the same as or similar to the material of the dielectric structure 104. An etching process is performed on the dielectric layer 111 using the patterned mask layer to remove portions of the dielectric layer 111 uncovered by the patterned mask layer, thereby forming trenches in the dielectric layer 111. A metal material is deposited over the dielectric layer 111 and fills the trenches, and a planarization (such as chemical mechanical polishing (CMP) process and/or etching back process) is then performed to remove excess metal material from the dielectric layer 111. Portions of the metal material remaining in the trenches form horizontal conductive features 110. The patterned mask layer may be removed by an ashing process and/or an etching process.

In some other embodiments, the formation of the horizontal conductive features 110 may include depositing a metal material over the dielectric structure 104, and forming a patterned mask layer over the metal material using a photolithography process. An etching process is performed using the patterned mask layer to remove portions of the metal material uncovered by the patterned mask layer. A remainder of the metal material forms the horizontal conductive features 110. Afterward, the dielectric layer 111 is formed to surround the horizontal conductive features 110.

The conductive segments $116_1$ and $116_2$ are configured as target lines during an e-beam inspection to confirm whether the overlay of the photolithography process for forming the horizontal conductive features 110 shifts. This will be described in detail later.

Referring to FIG. 1A-1, the conductive segments $116_1$ and $116_2$ are disposed immediately adjacent to and between the conductive line $112_1$ and the conductive line $112_2$. There is no other horizontal conductive feature 110 between the conductive line $112_1$ and conductive segment $116_1$ (or $116_2$), and there is no other horizontal conductive feature 110 between the conductive line $112_2$ and conductive segment $116_1$ (or $116_2$).

The conductive segment $116_1$ is disposed between two vertical conductive features 108 which are in contact with the conductive lines $112_1$ and $112_2$, respectively. In detail, the projection area of the conductive segment $116_1$ projected onto the conductive line $112_1$ in the first direction A1 covers a portion of the conductive line $112_1$ overlapping with (or in contact with) the vertical conductive feature 108. The projection area of the conductive segment $116_1$ projected onto the conductive line $112_2$ in the second direction A2 covers a portion of the conductive line $112_2$ overlapping with (or in contact with) the vertical conductive feature 108.

The conductive segment $116_2$ is disposed immediately adjacent to the vertical conductive feature 108 which is in contact with the conductive line $112_2$. In detail, the projection area of the conductive segment $116_2$ projected onto the conductive line $112_1$ in the first direction A1 does not cover a portion of the conductive line $112_1$ overlapping with (or in contact with) the vertical conductive feature 108, but the projection area of the conductive region $116_2$ projected onto the conductive line $112_2$ in the second direction A2 covers a portion of the conductive line $112_2$ overlapping with (or in contact with) the vertical conductive feature 108.

In order to confirm whether the overlay of the photolithography process for forming the horizontal conductive features 110 shifts, an e-beam inspection can be performed after the formation of the horizontal conductive features 110. FIGS. 1B-1D are plan views of the horizontal conductive features 110 during the e-beam inspection, in accordance with some embodiments of the present disclosure. FIGS. 1C-1 and 1D-1 are cross-sectional views of the semiconductor structure, in which left parts and right parts of FIGS. 1C-1 and 1D-1 respectively correspond to line I-I and line II-II shown in FIG. 1A, in accordance with some embodiments of the present disclosure.

FIG. 1B illustrates an embodiment in which the overlay of the photolithography process does not shift. Referring to FIGS. 1B and 1A, because the conductive lines $112_1$ and $112_2$ are electrically connected to the conductive element 106 (such as the gate structures of the active devices)

through the vertical conductive features 108, the conductive lines 112₁ and 112₂ appear bright during the e-beam inspection. Because the conductive segments 116₁ and 116₂ used as the target lines are not electrically connected to the vertical conductive features 108, the conductive segments 116₁ and 116₂ appear dark during the e-beam inspection.

FIGS. 1C and 1C-1 illustrate an embodiment in which the overlay of the photolithography process shifts in the first direction A1. Referring to FIGS. 1C and 1C-1 and FIG. 1A, because the conductive segment 116₁ shifts in the first direction A1, the conductive segment 116₁ is in contact with and electrically connected to the vertical conductive feature 108, thereby being electrically connected to the active devices in the substrate 102. However, the conductive segment 116₂ keeps electrically isolated from the vertical conductive features 108. Therefore, the conductive segment 116₁ appears bright and the conductive segment 116₂ appears dark during the e-beam inspection.

FIGS. 1D and 1D-1 illustrate an embodiment in which the overlay of the photolithography process shifts in the second direction A2. Referring to FIGS. 1D and 1D-1 and FIG. 1A, because the conductive segments 116₁ and 116₂ shift in the second direction A2, the conductive segment 116₁ is in contact with and electrically connected to the vertical conductive feature 108, thereby being electrically connected to the active devices in the substrate 102. In addition, the conductive segment 116₂ is in contact with and electrically connected to the vertical conductive feature 108, thereby being electrically connected to the active devices in the substrate 102. Therefore, both the conductive segments 116₁ and 116₂ appear bright during the e-beam inspection.

When performing the e-beam inspection on the horizontal conductive features 110, it is possible to determine whether the overlap of the photolithography process for forming the horizontal conductive member 110 shifts by observing the brightness of the conductive segments 116₁ and 116₂, and further distinguish in which direction the shift occurs. Therefore, the arrangement of the horizontal conductive features of the embodiments of the present disclosure helps provide clearer defect information during the manufacturing of the semiconductor device. In some embodiments, subsequent processes can be adjusted according to the shift direction to compensate for the shift of the horizontal conductive features, thereby improving the manufacturing yield of the resulting semiconductor device.

Figure 2A:
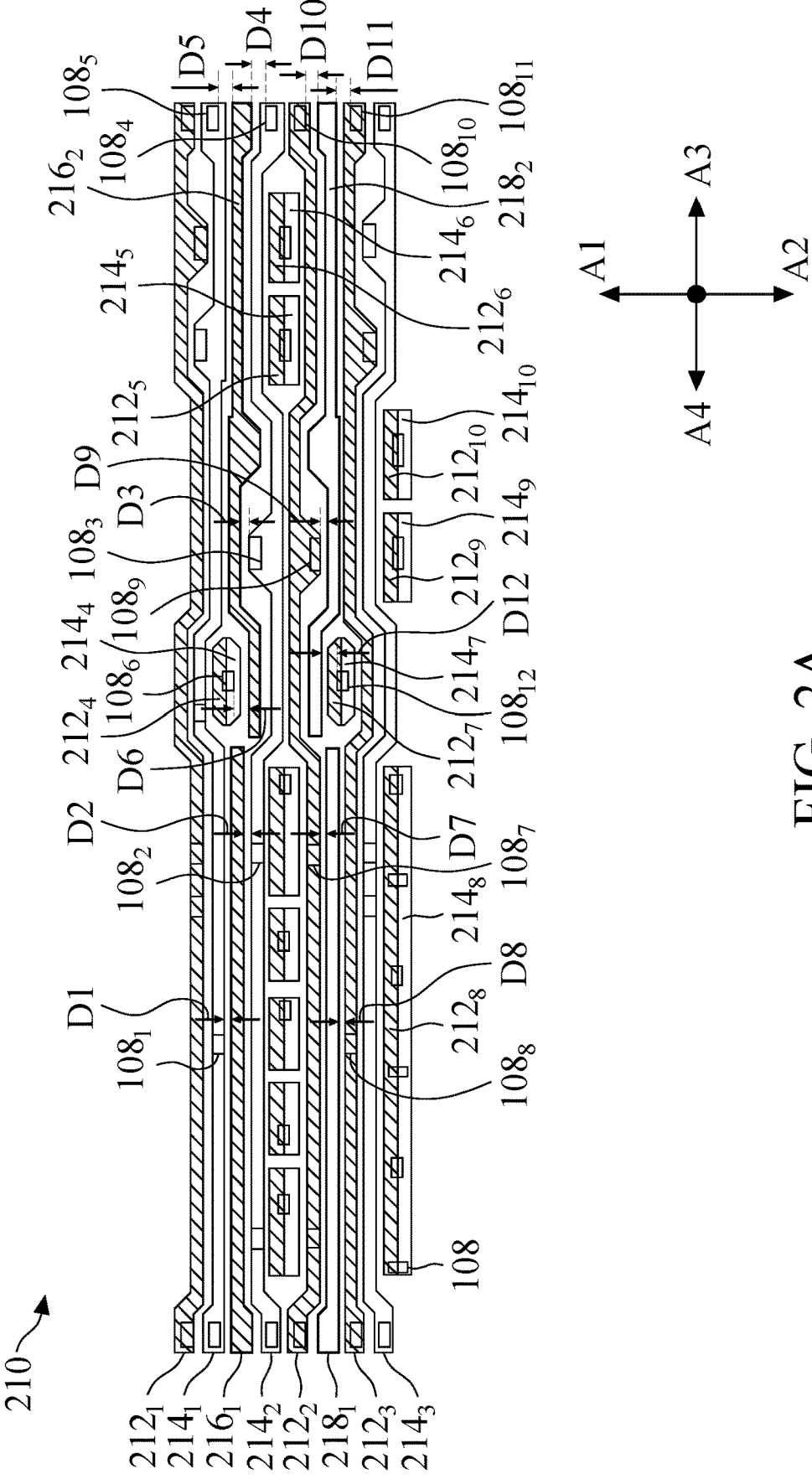

FIG. 2A is a plan view of horizontal conductive features 210 of a semiconductor structure, in accordance with some embodiments of the present disclosure. The difference between the horizontal conductive features 210 of FIG. 2A and the horizontal conductive features 110 of FIG. 1A is that the horizontal conductive features 210 are formed by two photolithography processes.

The horizontal conductive features 210 are disposed over the dielectric structure 104 as shown in FIG. 1A-1 and include first conductive lines 212₁₋₁₀, second conductive lines 214₁₋₁₀, first conductive segments 216₁ and 216₂, and second conductive segments 218₁ and 218₂. The horizontal conductive features 210 have longitudinal axes which extend in the third direction A3 and the fourth direction A4. Each of the first conductive lines 212₁₋₁₀ and the second conductive lines 214₁₋₁₀ is in contact with and electrically connected to at least one of the underlying vertical conductive features 108. In some embodiments, some of the first conductive lines 212 and the second conductive lines 214 (such as the first conductive line 212₄ and the second conductive line 214₄) are in contact with each other and share the conductive feature 108. The first conductive segments 216₁ and 216₂ are separated from and electrically isolated from the vertical conductive features 108, and the second conductive segments 218₁ and 218₂ are separated from and electrically isolated from the vertical conductive features 108. The first conductive segments 216₁ and 216₂ are separated from and electrically isolated from each other. The second conductive segments 218₁ and 218₂ are separated from and electrically isolated from each other.

The horizontal conductive features 210 may be made of one or more metal materials such as tungsten (W), aluminum (Al), copper (Cu), titanium (Ti), Tantalum (Ta), titanium nitride (TiN), tantalum nitride (TaN), or a combination thereof. The formation of the horizontal conductive features 210 may include forming a dielectric layer 111 over the dielectric structure 104, and forming a first patterned mask layer over the dielectric layer 111 using a first photolithography process. The first patterned mask layer has first opening patterns corresponding to the first conductive lines 212₁₋₁₀ and the first conductive segments 216₁ and 216₂. An etching process is performed on the dielectric layer 111 to remove portions of the dielectric layer 111 exposed from the first opening patterns, thereby forming first trenches in the dielectric layer 111. The first patterned mask layer may be removed by an ashing process and/or an etching process.

Afterward, a second patterned mask layer is formed over the dielectric layer 111 using a second photolithography process over the dielectric layer 111. The second patterned mask layer has second opening patterns corresponding to the second conductive lines 214₁₋₁₀ and the second conductive segments 218₁ and 218₂. An etching process is performed on the dielectric layer 111 using the second patterned mask layer to remove portions of the dielectric layer 111 exposed from the second opening patterns, thereby forming second trenches in the dielectric layer 111. The first trenches (corresponding to the first conductive lines 212₁₋₁₀ and the first conductive segments 216₁ and 216₂) and the second trenches (corresponding to the second conductive lines 214₁₋₁₀ and the second conductive segments 218₁ and 218₂) are alternatingly arranged in the first direction A1 and the second direction A2. The wiring density of the horizontal conductive features 210 can be increased by two photolithography processes. The second patterned mask layer may be removed by an ashing process and/or an etching process.

A metal material is deposited over the dielectric layer 111 to fill the first trenches and the second trenches. A planarization process is performed to remove any excess metal material from the dielectric layer 111. Portions of the metal material remaining in the first trenches form the first conductive lines 212₁₋₁₀ and the first conductive segments 216₁ and 216₂, and portions of the metal material remaining in the second trenches form the second conductive lines 214₁₋₁₀ and the second conductive segments 218₁ and 218₂.

The first conductive segments 216₁ and 216₂ and the second conductive segments 218₁ and 218₂ are configured as target lines during e-beam inspection to confirm whether the overlay of the first photolithography process and the overlay of the second photolithography process for forming the horizontal conductive features 210 shift.

The first conductive segment 216₁ and first conductive segment 216₂ are disposed immediately adjacent to and between the second conductive line 214₁ and the second conductive line 214₂. The first conductive segment 216₁ is spaced a distance D1 apart from the vertical conductive feature 108₁ (which is in contact with the second conductive line 214₁), and it is spaced a distance D2 apart from the vertical conductive feature 108₂ (which is in contact with the second conductive line 214₂). The distance D1 and the distance D2 are less than or equal to the shift distance of the first photolithography process. The distance D1 may be substantially equal to the distance D2.

The first conductive segment $216_2$ is spaced a distance D3 apart from the vertical conductive feature $108_3$ (which is in contact with the second conductive line $214_2$), a distance D4 apart from the vertical conductive feature $108_4$ (which is in contact with the second conductive line $214_2$), and a distance D5 apart from the vertical conductive feature $108_5$ (which is in contact with the second conductive line $214_1$). The distance D3 is shorter than or equal to the shift distance of the first photolithography process. The distance D5 is longer than the shift distance of the first photolithography process. The distance D3 may be substantially equal to the distance D2. The distance D4 is longer than distance D3, and the distance D5 is longer than the distance D1. In addition, the first conductive segment $216_2$ is spaced a distance D6 apart from the vertical conductive feature $108_6$ (which is in contact with the second conductive line $214_4$). The distance D6 is longer than the shift distance of the first photolithography process, and longer than the distance D1.

The second conductive segment $218_1$ and the second conductive segment $218_2$ are disposed immediately adjacent to and between the first conductive line $212_1$ and the first conductive line $212_2$. The second conductive segment $218_1$ is spaced a distance D7 apart from the vertical conductive feature $108_7$ (which is in contact with the first conductive line $212_2$), and a distance D8 apart from the vertical conductive feature $108_8$ (which is in contact with the first conductive line $212_3$). The distances D7 and D8 are shorter than or equal to the shift distance of the second photolithography process. The distance D7 may be substantially equal to the distance D8.

The second conductive segment $218_2$ is spaced a distance D9 apart from the vertical conductive feature $108_9$ (which is in contact with the first conductive line $212_2$), a distance D10 apart from another vertical conductive feature $108_{10}$ (which is in contact with the first conductive line $212_2$), and a distance D11 apart from the vertical conductive feature $108_{11}$ (which is in contact with the first conductive line $212_3$). The distance D9 is shorter than or equal to the shift distance of the second photolithography process. The distance D11 is longer than the shift distance of the second photolithography process. The distance D9 may be substantially equal to the distance D7. The distance D10 is longer than the distance D9, and the distance D11 is longer than the distance D8. In addition, the second conductive segment $218_2$ is spaced a distance D12 apart from the vertical conductive feature $108_{12}$ (which is in contact with the first conductive line $212_7$). The distance D12 is longer than the shift distance of the second photolithography process, and longer than the distance D8.

In order to confirm whether the overlays of the first and second photolithography processes for forming the horizontal conductive features 210 shift, an e-beam inspection can be performed after the formation of the horizontal conductive features 210. FIGS. 2B-2F are plan views of the horizontal conductive features 210 during the e-beam inspection, in accordance with some embodiments of the present disclosure.

FIG. 2B illustrates an embodiment in which both the overlay of the first photolithography process and the overlay of the second photolithography process do not shift. Because the first conductive segments $216_1$ and $216_2$ and the second conductive segments $218_1$ and $218_2$ used as the target lines are not electrically connected to the vertical conductive features 108, the conductive segments $216_1$, $216_2$, $218_1$ and $218_2$ appear dark during the e-beam inspection.

FIG. 2C illustrates an embodiment in which the overlay of the second photolithography process shifts in the first direction A1 while the overlay of the first photolithography process does not shift. Referring to FIG. 2C and FIG. 2A, when the shift distance is greater than or equal to the distance D7 or D9, the second conductive segment $218_1$ is in contact with and electrically connected to the vertical conductive feature $108_7$, thereby being electrically connected to the active devices in the substrate 102. In addition, the second conductive segment $218_2$ is in contact with and electrically connected to the vertical conductive feature $108_9$, thereby being electrically connected to the active devices in the substrate 102. Therefore, both the second conductive segments $218_1$ and $218_2$ appear bright during the e-beam inspection.

FIG. 2D illustrates an embodiment in which the overlay of the second photolithography process shifts in the second direction A2 while the overlay of the first photolithography process does not shift. Referring to FIG. 2D and FIG. 2A, when the shift distance is greater than or equal to the distance D8 and less than the distance D11 or D12, the second conductive segment $218_1$ is in contact with and electrically connected to the vertical conductive feature $108_8$, thereby being electrically connected to the active devices in the substrate 102. In addition, the second conductive segment $218_2$ keeps electrically isolated from the vertical conductive features 108. Therefore, the second conductive segment $218_1$ appears bright and the second conductive segment $218_2$ appears dark during the e-beam inspection.

FIG. 2E illustrates an embodiment in which the overlay of the first photolithography process shifts in the first direction A1 while the overlay of the second photolithography process does not shift. Referring to FIG. 2E and FIG. 2A, when the shift distance is greater than or equal to the distance D1 and less than the distance D5 or D6, the first conductive segment $216_1$ is in contact with and electrically connected to the vertical conductive feature $108_1$, thereby being electrically connected to the active devices in the substrate 102. In addition, the first conductive segment $216_2$ keeps electrically isolated from the vertical conductive features 108. Therefore, the first conductive segment $216_1$ appears bright and the first conductive segment $216_2$ appears dark during the e-beam inspection.

FIG. 2F illustrates an embodiment in which the overlay of the first photolithography process shifts in the second direction A2 while the overlay of the second photolithography process does not shift. Referring to FIG. 2F and FIG. 2A, when the shift distance is greater than or equal to the distance D2 or D3, the first conductive segment $216_1$ is in contact with and electrically connected to the vertical conductive feature $108_2$, thereby being electrically connected to the active devices in the substrate 102. In addition, the first conductive segment $216_2$ is in contact with and electrically connected to the vertical conductive feature $108_3$, thereby being electrically connected to the active devices in the substrate 102. Therefore, both the first conductive segments $216_1$ and $216_2$ appear bright during the e-beam inspection.

When performing the e-beam inspection on the horizontal conductive features 210, it is possible to determine whether the overlaps of the first and second photolithography processes for forming the horizontal conductive member 210 shift by observing the brightness of the conductive segments $216_1$, $216_2$, $218_1$ and $218_2$, and further distinguish in which direction the shift occurs.

Figure 3A:
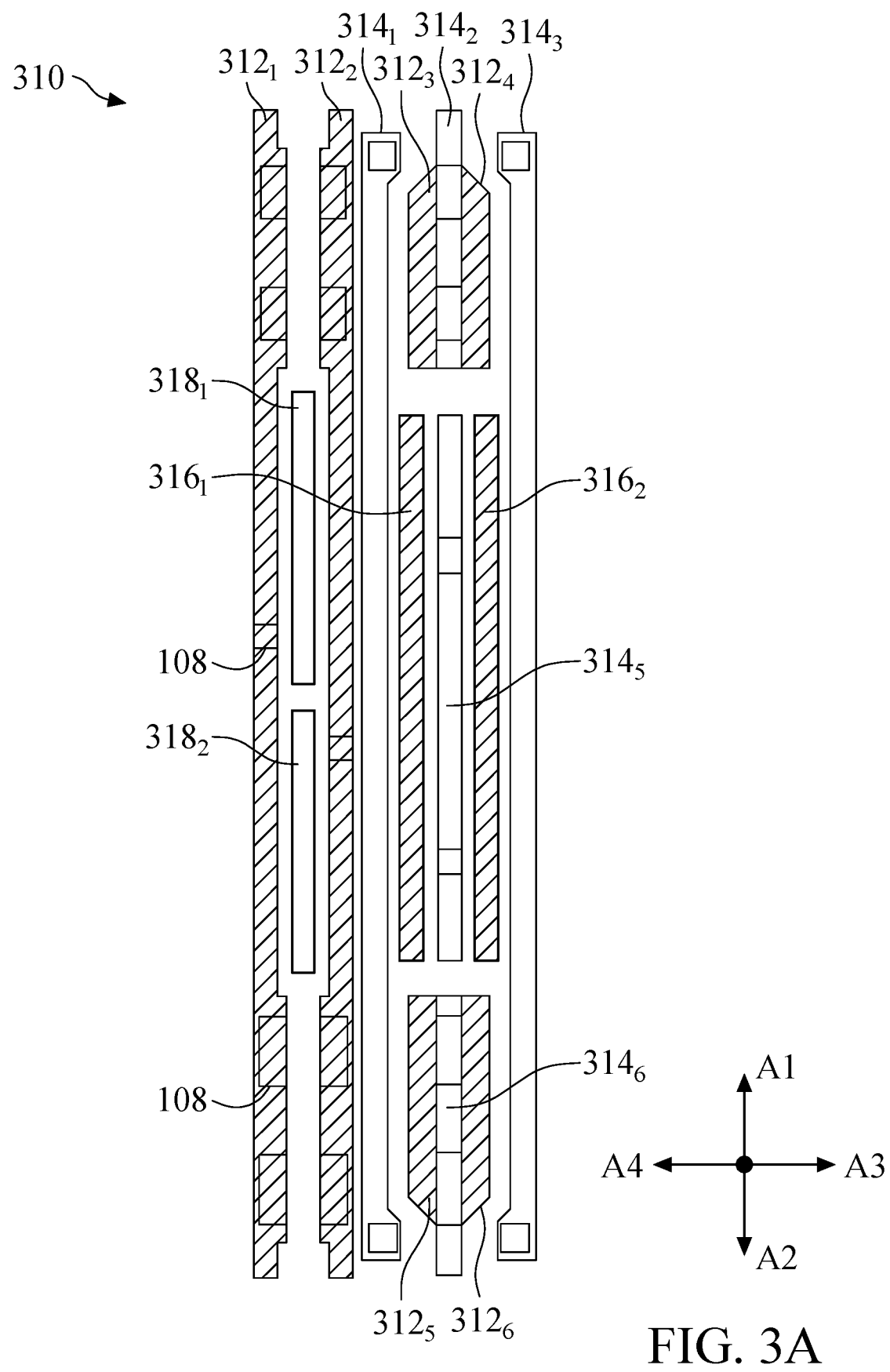

FIG. 3A is a plan view of horizontal conductive features $310$ of a semiconductor structure, in accordance with some embodiments of the present disclosure. The difference between the horizontal conductive features $310$ of FIG. 3A and the horizontal conductive features $210$ of FIG. 2A is a conductive line interposing between two conductive segments of the horizontal conductive features $310$.

The horizontal conductive features $310$ are disposed over the dielectric structure $104$ as shown in FIG. 1A-1 and include first conductive lines $312_{1-6}$, second conductive lines $314_{1-6}$, first conductive segments $316_1$ and $316_2$, and second conductive segments $318_1$ and $318_2$. The horizontal conductive features $310$ have longitudinal axes which extend in the first direction A1 and the second direction A2. Each of the first conductive lines $312_{1-6}$ and the second conductive lines $314_{1-6}$ is in contact with and electrically connected to at least one of the vertical conductive features $108$. In some embodiments, some of the first conductive lines $312$ and the second conductive lines $314$ (such as the first conductive lines $312_3$ and $312_4$ and the second conductive line $314_2$) are in contact with each other. The first conductive segments $316_1$ and $316_2$ are separated from and electrically isolated from the vertical conductive features $108$, and the second conductive segments $318_1$ and $318_2$ are separated from and electrically isolated from the vertical conductive features $108$. The first conductive segments $316_1$ and $316_2$ are separated from and electrically isolated from each other. The second conductive segments $318_1$ and $318_2$ are separated from and electrically isolated from each other.

The material and the formation of the horizontal conductive features $310$ may the same as or similar to the material and the formation of the horizontal conductive features $210$ described above in FIG. 2A. For example, first trenches corresponding to the first conductive lines $312_{1-6}$ and the first conductive segments $316_1$ and $316_2$ may be formed using a first photolithography process and an etching process. Second trenches corresponding to the second conductive lines $314_{1-6}$ and the second conductive segments $318_1$ and $318_2$ may be formed using a second photolithography process and an etching process. The first trenches and the second trenches are alternatingly arranged in the third direction D3 and the fourth direction D4. Afterward, a metal material is deposited to fill the first trenches and the second trenches, thereby forming the horizontal conductive features $310$.

The first conductive segments $316_1$ and $316_2$ and the second conductive segments $318_1$ and $318_2$ are configured target as lines during an e-beam inspection to confirm whether the overlay of the first photolithography process and the overlay of the second photolithography process for forming the horizontal conductive features $210$ shift.

The first conductive segment $316_1$ is disposed between second conducive line $314_1$ and the second conductive line $314_5$. The second conductive line $314_5$ is disposed between the first conductive segment $316_1$ and the first conductive segment $316_2$. The vertical conductive feature $108$ in contact with the second conductive line $314_5$ is disposed between the first conductive segment $316_1$ and the first conductive segment $316_2$. The first conductive segment $316_1$ is disposed immediately adjacent to the vertical conductive feature $108$ which is in contact with the second conductive line $314_5$, but not immediately adjacent to the vertical conductive feature $108$ which is in contact with the second conductive line $314_1$. The first conductive segment $316_2$ is disposed immediately adjacent to the vertical conductive feature $108$ which is in contact with the second conductive line $314_5$, but not immediately adjacent to the vertical conductive feature $108$ which is in contact with the second conductive line $314_3$.

The second conductive segment $318_1$ and the second conductive segment $318_2$ are disposed between the first conducive line $312_1$ and the first conductive line $312_2$. The second conductive segment $318_1$ is disposed immediately adjacent to the vertical conductive feature $108$ which is in contact with the first conductive line $312_1$, but not immediately adjacent to the vertical conductive feature $108$ which is in contact with the first conductive line $312_2$. The second conductive segment $318_2$ is disposed immediately adjacent to the vertical conductive feature $108$ which is in contact with the first conductive line $312_2$, but not immediately adjacent to the vertical conductive feature $108$ which is in contact with the first conductive line $312_1$.

In order to confirm whether the overlays of the first and second photolithography processes for forming the horizontal conductive features $310$ shift, an e-beam inspection can be performed after the formation of the horizontal conductive features $310$. FIGS. 3B-3F are plan views of the horizontal conductive features $310$ during the e-beam inspection, in accordance with some embodiments of the present disclosure.

Figures 3B, 3C, 3D, 3E, 3F:
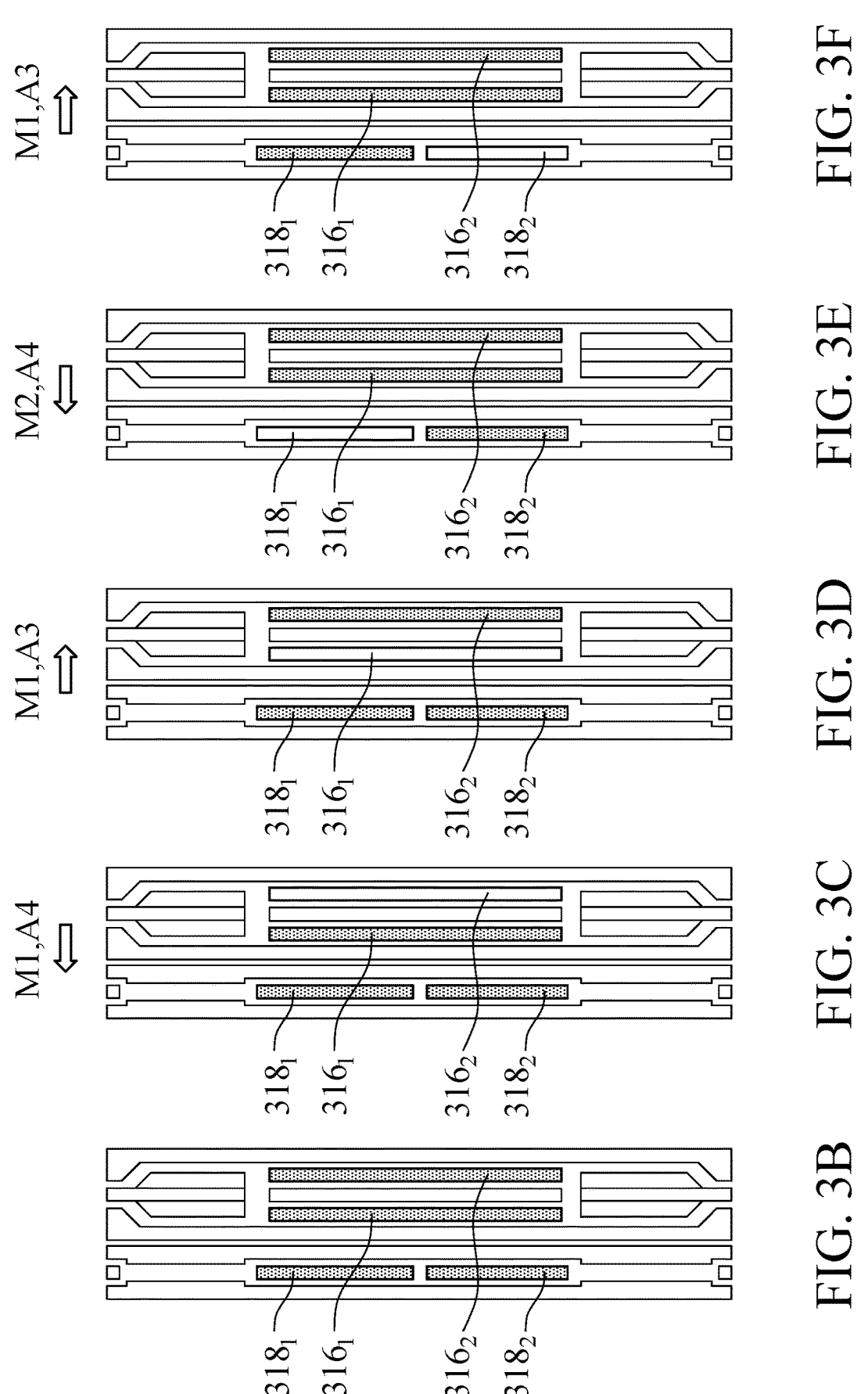

FIG. 3B illustrates an embodiment in which both the overlay of the first photolithography process and the overlay of the second photolithography process do not shift. Because the first conductive segments $316_1$ and $316_2$ and the second conductive segments $318_1$ and $318_2$ used as the target lines are not electrically connected to the vertical conductive features $108$, the conductive segments $316_1$, $316_2$, $318_1$ and $318_2$ appear dark during the e-beam inspection.

FIG. 3C illustrates an embodiment in which the overlay of the first photolithography process shifts in the fourth direction A4 while the overlay of the second photolithography process does not shift. Referring to FIG. 3C and FIG. 3A, because the first conductive segments $316_1$ and $316_2$ shift in the fourth direction A4, the first conductive segment $316_1$ keeps electrically isolated from the vertical conductive features $108$, while the first conductive segment $316_2$ is in contact with and electrically connected to the vertical conductive feature $108$ in contact with the second conductive line $314_5$. Therefore, the first conductive segment $316_1$ appears dark and the first conductive segment $316_2$ appears bright during the e-beam inspection.

FIG. 3D illustrates an embodiment in which the overlay of the first photolithography process shifts in the third direction A3 while the overlay of the second photolithography process does not shift. Referring to FIG. 3D and FIG. 3A, because the first conductive segments $316_1$ and $316_2$ shift in the third direction A3, the first conductive segment $316_1$ is in contact with and electrically connected to the vertical conductive feature $108$ in contact with the second conductive line $314_5$, while the first conductive segment $316_2$ keeps electrically isolated from the vertical conductive features $108$. Therefore, the first conductive segment $316_1$ appears bright and the first conductive segment $316_2$ appears dark during the e-beam inspection.

FIG. 3E illustrates an embodiment in which the overlay of the second photolithography process shifts in the fourth direction A4 while the overlay of the first photolithography process does not shift. Referring to FIG. 3E and FIG. 3A, because the second conductive segments $318_1$ and $318_2$ shift in the fourth direction A4, the second conductive segment $318_1$ is in contact with and electrically connected to the vertical conductive feature $108$ in contact with the first conductive line $312_1$, while the second conductive segment $318_2$ keeps electrically isolated from the vertical conductive features 108. Therefore, the second conductive segment 318$_1$ appears bright and the second conductive segment 318$_2$ appears dark during the e-beam inspection.

FIG. 3F illustrates an embodiment in which the overlay of the second photolithography process shifts in the third direction A3 while the overlay of the first photolithography process does not shift. Referring to FIG. 3F and FIG. 3A, because the second conductive segments 318$_1$ and 318$_2$ shift in the third direction A3, the second conductive segment 318$_1$ keeps electrically isolated from the vertical conductive features 108, while the second conductive segment 318$_2$ is in contact with and electrically connected to the vertical conductive feature 108 in contact with the second conductive line 312$_2$. Therefore, the second conductive segment 318$_1$ appears dark and the second conductive segment 318$_2$ appears bright during the e-beam inspection.

When performing the e-beam inspection on the horizontal conductive features 310, it is possible to determine whether the overlaps of the first and second photolithography processes for forming the horizontal conductive member 310 shift by observing the brightness of the conductive segments 316$_1$, 316$_2$, 318$_1$ and 318$_2$, and further distinguish in which direction the shift occurs.

As described above, the embodiments of the present disclosure utilize two conductive segments which are isolated from the vertical conductive feature as target lines to confirm whether the overlay of the photolithography process shifts. By using the configuration relationship between one conductive segment and the adjacent vertical conductive feature being different from the configuration relationship between the other conductive segment and the adjacent vertical conductive feature, the shift direction can be distinguished, thereby providing a clearer defect information.

While the disclosure has been described by way of example and in terms of the preferred embodiments, it should be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor structure, comprising:
vertical conductive features disposed over a substrate and extending in a vertical direction perpendicular to a main surface of the substrate; and
horizontal conductive features disposed over the vertical conductive features and extending in a first direction parallel to the main surface of the substrate, wherein the horizontal conductive features comprise:
a first conductive line and a second conductive line respectively electrically connected to a first vertical conductive feature and a second vertical conductive feature of the vertical conductive features;
a first conductive segment disposed between the first vertical conductive feature and the second conductive line in a second direction, wherein the first conductive segment is electrically isolated from the vertical conductive features, the second direction is parallel to the main surface of the substrate and perpendicular to the first direction; and
a second conductive segment disposed between the first conductive line and the second vertical conductive feature in the second direction, wherein the second conductive segment is electrically isolated from the vertical conductive features, wherein no horizontal conductive feature is disposed between the second conductive segment and the first conductive line in the second direction.

2. The semiconductor structure as claimed in claim 1, wherein the first conductive segment is electrically isolated from the second conductive segment.

3. The semiconductor structure as claimed in claim 1, wherein no horizontal conductive feature is disposed between the first conductive segment and the first conductive line, and no horizontal conductive feature is disposed between the first conductive segment and the second conductive line.

4. The semiconductor structure as claimed in claim 1, wherein no horizontal conductive feature is disposed between the second conductive segment and the second conductive line.

5. The semiconductor structure as claimed in claim 1, wherein the second conductive line is further electrically connected to a third vertical conductive feature of the vertical conductive features, and the first conductive segment is disposed between the first vertical conductive feature and the third vertical conductive feature.

6. The semiconductor structure as claimed in claim 5, wherein a distance between the first vertical conductive feature and the first conductive segment is equal to a distance between the third vertical conductive feature and the first conductive segment.

7. The semiconductor structure as claimed in claim 1, wherein the first conductive line is further electrically connected to a third vertical conductive feature of the vertical conductive features, the second conductive segment is disposed between the second vertical conductive feature and the third vertical conductive feature, and a distance between the first vertical conductive feature and the first conductive segment is less than a distance between the third vertical conductive feature and the second conductive segment.

8. The semiconductor structure as claimed in claim 1, wherein the horizontal conductive features further comprise:
a third conductive segment and a fourth conductive segment, wherein the third conductive segment is electrically isolated from the vertical conductive features, and the fourth conductive segment is electrically isolated from the vertical conductive features; and
a third conductive line disposed between the third conductive segment and the fourth conductive segment and electrically connected to a third vertical conductive feature of the vertical conductive features.

9. A semiconductor structure, comprising:
conductive plugs disposed over a substrate; and
a first conductive line, a second conductive line, a first conductive segment and a second conductive segment disposed over the conductive plugs and extending in a first direction, wherein:
the first conductive segment and the second conductive segment are disposed between the first conductive line and the second conductive line,
the first conductive line is electrically connected to a first contact plug of the conductive plugs, and the second conductive line is electrically connected to a second contact plug of the conductive plugs, p2 a projection area of the first conductive segment projected onto the first conductive line in a second direction covers the first contact plug, and the second direction is perpendicular to the first direction, and
a projection area of the second conductive segment projected onto the second conductive line in a third direction covers the second contact plug, and the third direction is perpendicular to the first direction and opposite to the second direction, wherein the projection area of the first conductive segment and the projection area of the second conductive segment are offset from each other in the second direction or the third direction, wherein the second conductive line is electrically connected to a third contact plug of the contact plugs, and a projection area of the first conductive segment projected onto the second conductive line in the third direction covers the third contact plug.

10. The semiconductor structure as claimed in claim 9, wherein a projection area of the second conductive segment projected onto the first conductive line in the second direction does not cover the contact plugs.

11. The semiconductor structure as claimed in claim 9, further comprising:

a third conductive segment, a fourth conductive segment and a third conductive line disposed over the contact plugs and extending in the first direction, wherein:

the third conductive line is disposed between the third conductive segment and the fourth conductive segment, the third conductive line is electrically connected to a third contact plug of the conductive plugs, a projection area of the third conductive segment projected onto the third conductive line in the second direction covers the third contact plug, and a projection area of the fourth conductive segment projected onto the third conductive line in the third direction covers the third contact plug.

12. A method for forming a semiconductor structure, comprising:

forming contact plugs over a substrate;

forming a dielectric layer over the contact plugs;

etching the dielectric layer using a first patterned mask layer to form a first trench and a second trench;

etching the dielectric layer using a second patterned mask layer to form a third trench and a fourth trench; and depositing a metal material to form a first conductive segment in the first trench, a second conductive segment in the second trench, a first conductive line in the third trench, and a second conductive line in the fourth trench, wherein the first conductive segment is electrically isolated from the contact plugs, the second conductive segment is electrically isolated from the contact plugs, and the first conductive line and the second conductive line are electrically connected to a first contact plug and a second contact plug of the contact plugs, respectively, wherein the first conductive segment projected onto the first conductive line in a second direction covers the first contact plug, and the second direction is perpendicular to the first direction, wherein a projection area of the second conductive segment projected onto the second conductive line in a third direction covers the second contact plug, and the third direction is perpendicular to the first direction and opposite to the second direction, wherein the second conductive line is electrically connected to a third contact plug of the contact plugs, and a projection area of the first conductive segment projected onto the second conductive line in the third direction covers the third contact plug.

13. The method for forming the semiconductor structure as claimed in claim 12, wherein the first conductive segment is disposed between the first contact plug and the second conductive line, and the second conductive segment is disposed between the first conductive line and the second contact plug.

14. The method for forming the semiconductor structure as claimed in claim 12, wherein the first conductive line is electrically connected to the third contact plug of the contact plugs, the second conductive segment is disposed between the third contact plug and the second contact plug, and a distance between the first contact plug and the first conductive segment is less than a distance between the second contact plug and the second conductive segment.

15. The method for forming the semiconductor structure as claimed in claim 12, wherein:

the dielectric layer is etched using the first patterned mask layer to form a fifth trench and a sixth trench, the dielectric layer is etched using the second patterned mask layer to form a seventh trench and an eighth trench, the metal material is deposited to form a third conductive line in the fifth trench, a fourth conductive line in the sixth trench, a third conductive segment in the seventh trench, and a fourth conductive segment in the eighth trench, the third conductive segment is electrically isolated from the contact plugs, the fourth conductive segment is electrically isolated from the contact plugs, and the third conductive line and the fourth conductive line are electrically connected to a third contact plug and a fourth contact plug of the contact plugs, respectively.

16. The method for forming the semiconductor structure as claimed in claim 15, further comprising:

forming the first patterned mask layer using a first photolithography process, wherein the first conductive segment and the second conductive segment are target lines that are configured to identify a shift direction of the first lithography process; and after forming the first patterned mask layer, forming the second patterned mask layer using a second photolithography process, wherein the third conductive segment and the fourth conductive segment are target lines that are configured to identify a shift direction of the second lithography process.

* * * * *